United States Patent [19]
Sim

[11] Patent Number: 5,597,763
[45] Date of Patent: Jan. 28, 1997

[54] METHOD FOR MANUFACTURING A SEMICONDUCTOR WIRING STRUCTURE INCLUDING A SELF-ALIGNED CONTACT HOLE

[75] Inventor: Sang-pil Sim, Kyungki-do, Rep. of Korea

[73] Assignee: Samsung Electronics Co., Ltd., Suwon, Rep. of Korea

[21] Appl. No.: 427,855

[22] Filed: Apr. 26, 1995

Related U.S. Application Data

[62] Division of Ser. No. 280,887, Jul. 27, 1994.

[30] Foreign Application Priority Data

Jul. 27, 1993 [KR] Rep. of Korea ............... 9314293

[51] Int. Cl.⁶ ............................................. H01L 21/28
[52] U.S. Cl. ........................ 437/195; 437/50; 437/51; 437/984
[58] Field of Search ................... 437/195, 50, 51, 437/984; 257/208, 210, 214

[56] References Cited

U.S. PATENT DOCUMENTS 4,967,393  10/1990  Yokoyomo et al. ................. 257/211

FOREIGN PATENT DOCUMENTS

| 58-058741 | 4/1983 | Japan . |
| 61-230359 | 10/1986 | Japan . |
| 2044767 | 2/1990 | Japan . |
| 2137356 | 5/1990 | Japan . |
| 6125065 | 5/1994 | Japan . |

OTHER PUBLICATIONS

IBM Technical Disclosure Bulletin, vol. 31, No. 4, Sep. 1988, pp. 249–252.

*Primary Examiner*—John Niebling
*Assistant Examiner*—Thomas G. Bilodeau
*Attorney, Agent, or Firm*—Cushman Darby & Cushman, L.L.P.

[57] ABSTRACT

In a highly integrated semiconductor wiring structure having a plurality of wiring layers and a self-aligned contact hole formed therebetween, the wiring layer is formed such that a portion where a contact hole will be formed is formed to a first wiring width and a remaining portion is formed to a second wiring width being wider than the first wiring width. In the method for manufacturing such a structure, the contact hole is formed in self-alignment fashion, and thus, a short which may occur due to misalignment can be prevented.

7 Claims, 7 Drawing Sheets

FIG. I
(PRIOR ART)

METHOD FOR MANUFACTURING A SEMICONDUCTOR WIRING STRUCTURE INCLUDING A SELF-ALIGNED CONTACT HOLE

This is a division of application Ser. No. 08/280,887, filed Jul. 27, 1994.

BACKGROUND OF THE INVENTION

The present invention relates to a highly integrated semiconductor device wiring structure and a method for manufacturing the same, and more particularly, to a highly integrated semiconductor device wiring structure using a self-aligned contact hole and a method for manufacturing the same.

As a semiconductor integrated circuit becomes highly integrated, a misalignment margin between a plurality of wiring layers or contact holes gradually diminishes. More particularly, in cases where the controlling design rule is limiting and complex patterns such as memory cells are repeated, a method wherein a contact hole is formed by a self-alignment technique so as to reduce the cell area is required.

The conventional method for forming a self-aligned contact hole is one in which the contact hole is formed using a step differential of a peripheral structure. Since contact holes of various sizes are obtained without using a mask according to the peripheral structure height, the insulating material thickness at the point where the contact hole is formed, and the the etching method used, the above method is suitable for obtaining a highly integrated semiconductor device.

A layout view of a conventional semiconductor memory device using the above-described self-aligned contact hole is shown in FIG. 1. Here, reference numeral 200 indicates a gate electrode, 300 and 350 indicate first and second pad electrodes, respectively, numeral 360 indicates a bit-line contact hole, numeral 400 indicates a bit-line electrode, and numeral 450 indicates a storage-node contact hole.

FIGS. 2 and 3 are cross-sectional views of a semiconductor memory device manufactured according to the conventional method, taken along lines AA' and BB' in FIG. 1, respectively.

Referring to FIGS. 2 and 3, after defining an active region 102 by forming an isolation region 104 on a semiconductor substrate 100, gate electrodes 200 of an access transistor, which extend in one direction, are formed on the substrate 100 with a gate oxide film (not shown) disposed therebetween. Then, after forming a first insulating film 220 over gate the electrodes 220, the first insulating-film 220 is anisotropically etched. Thereafter, impurity ions are implanted to obtain first and second impurity regions 150 and 160 in the substrate 100, which are separated from one another by the gate electrode 200. At this time, a contact hole (not shown), which exposes a predetermined portion of the active region 102, is formed in self-alignment with respect to the first insulating film 220 during the just-mentioned anisotropic etching of the first insulating film 220. Then, a conductive material is deposited on the resultant structure and is patterned by a lithography process, thereby forming first and second pad electrodes 300 and 350 which are connected with the first and second impurity regions 150 and 160, respectively. Thereafter, a second insulating film 320 is formed and etched to obtain a bit-line contact hole 360 over the second pad electrode 350 (see FIG. 1). Then, a conductive material is deposited and patterned by a lithography process to form bit-line electrodes 400 which are connected with the second pad electrode 350 through the bit-line contact hole 360. After forming a third insulating film 420 on the second insulating film 320, third and second insulating films 420 and 320 are etched to thereby form storage-node contact holes 450 over the first pad electrodes 300. Thereafter, storage nodes 500 (which are connected with the first pad electrodes 300 through storage-node contact holes 450), dielectric film 550, and plate node 600 are sequentially formed.

According to the above-described conventional method, the storage nodes 500 and the bit-line electrodes 400 are respectively connected with the first and second impurity regions 150 and 160 of the access transistor, using the first and second pad electrodes 300 and 350. Therefore, though misalignment occurs in the AA' direction of FIG. 1 during the process of forming the bit-line contact hole 360 and storage-node contact holes 450, a short between the gate electrode 200 and the bit-line electrode 400 or the storage node 500 can still be prevented. However, when the storage-node contact holes 450 are formed, a short between the storage node 500 and the bit-line electrode 400 may occur due to misalignment with respect to the bit line electrode 400, thus deteriorating reliability in the semiconductor memory device.

SUMMARY OF THE INVENTION

Accordingly, it is an object of the present invention to provide a reliable, highly integrated semiconductor wiring structure using a self-aligned contact hole.

It is another object of the present invention to provide a method for manufacturing a highly integrated semiconductor wiring structure especially suitable for manufacturing the above-mentioned contact hole.

To accomplish the above object, a semiconductor device wiring structure is provided having a plurality of wiring layers and a contact hole formed between respective wiring layers. The wiring layers are formed so that a region between respective wires where a contact hole is formed has a first width extending between the wiring layers, and a remaining interval between the wiring layers has a second width being narrower than the first width.

In addition, a method is provided for manufacturing a highly integrated semiconductor device wiring structure having a plurality of wiring layers and a contact hole formed between respective wiring layers, comprising the steps of:

forming first wiring layers on a semiconductor substrate such that a region between respective first wiring layers where a contact hole is to be formed has a first width extending between the wiring layers and a remaining portion therebetween has a second width being narrower than the first width;

forming an insulating film on the substrate on which the first wiring layers are formed;

etching the insulating film to thereby form a contact hole between respective first wiring layers, at the region having the first width therebetween; and forming a second wiring layer on the insulating film having the contact hole formed therein.

According to the present invention, a contact hole is thus formed between neighboring wiring layers without a lithography process so as to cause the contact hole to be self-aligned with respect to the wiring layer.

BRIEF DESCRIPTION OF THE DRAWINGS

The above objects and advantages of the present invention will become more apparent by describing in detail a preferred embodiment thereof with reference to the attached drawings in which:

FIGS. 8A, 9A and 10 are taken along line BB' in FIG. 7, and FIGS. 8B and 9B are taken along line CC' in FIG. 7.

DETAILED DESCRIPTION OF THE INVENTION

The present invention will be explained in more detail with reference to the attached drawings.

FIGS. 4A & 4B, FIGS. 5A, 5B & 5C and FIGS. 6A & 6B are layout diagrams and cross-sectional views for illustrating a highly integrated semiconductor wiring structure according to the present invention. Certain details are omitted in one of a corresponding pair of layout and cross-sectional views for clarity.

Figure 1:
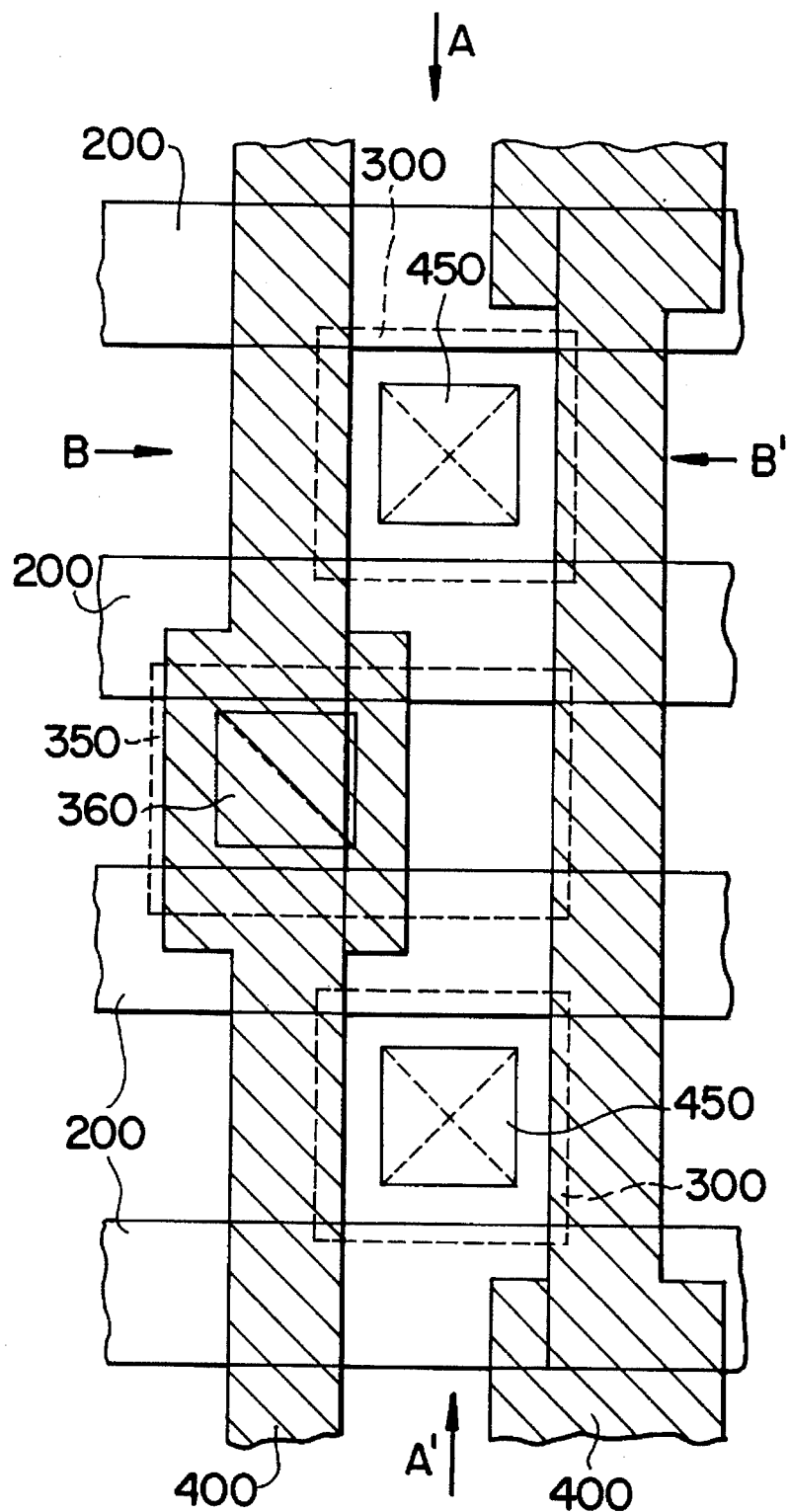
FIG. 1 is a layout diagram showing a semiconductor memory device according to a conventional method.
Figure 2:
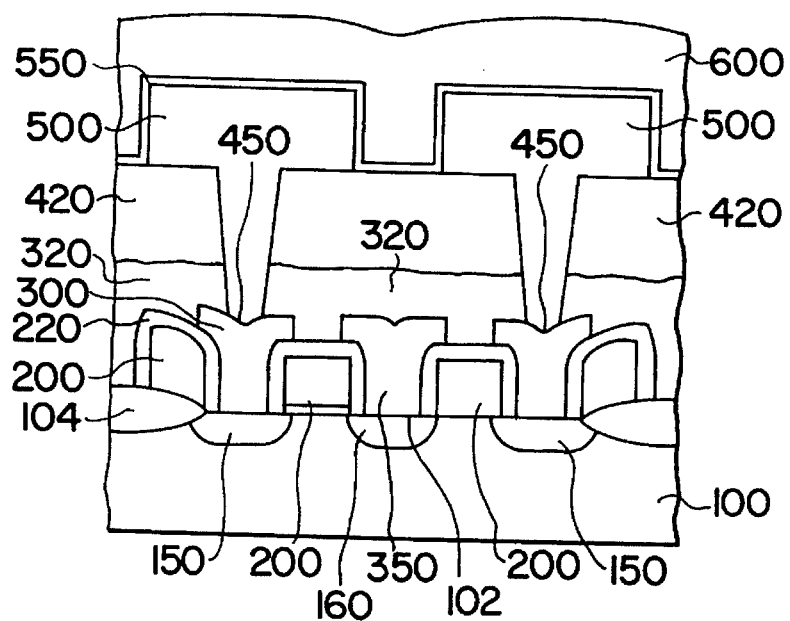
FIGS. 2 and 3 are cross-sectional views of a semiconductor memory device manufactured according to a conventional method, taken along lines AA' and BB' in FIG. 1, respectively.
Figure 3:
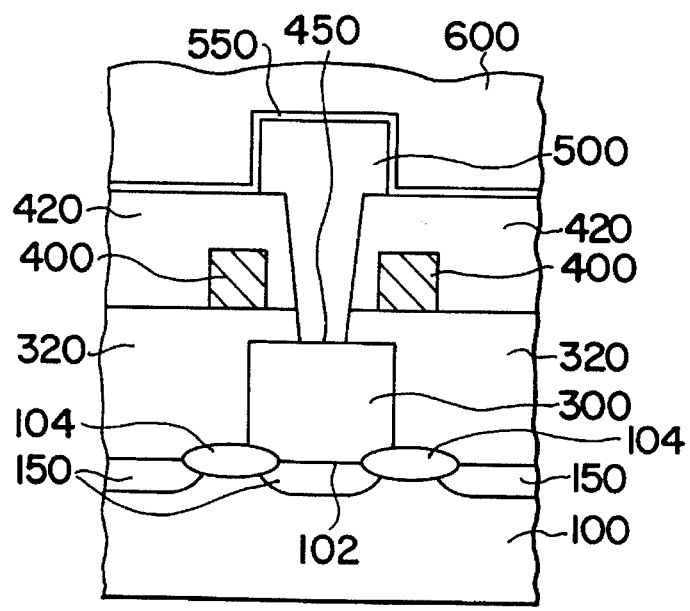
Figure 4A:
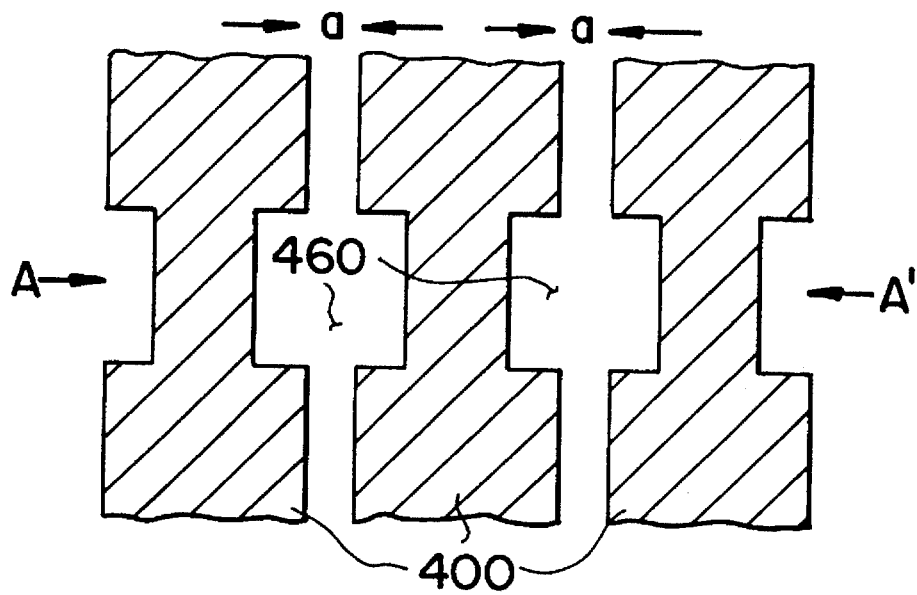
FIGS. 4A & 4B, FIGS. 5A, 5B & 5C and FIGS. 6A & 6B are layout diagrams and cross-sectional views for illustrating a highly integrated semiconductor device wiring structure according to the present invention.
Figure 4B:
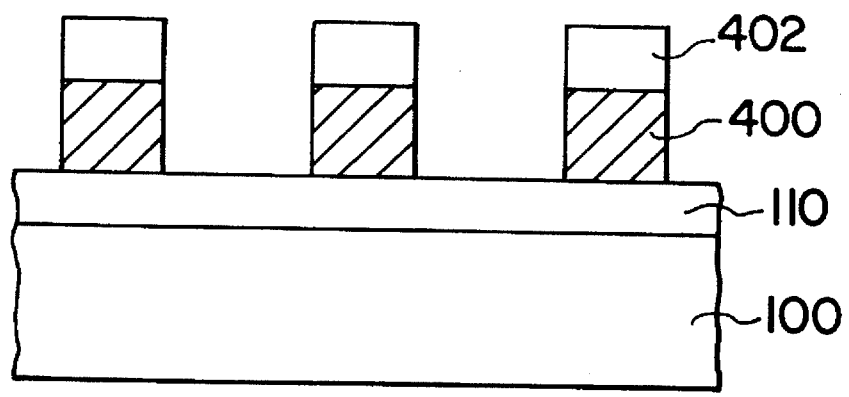

FIG. 4A is a layout diagram of a semiconductor device wiring structure wherein a plurality of wiring layers 400 are formed in a generally parallel orientation, and FIG. 4B is a cross-sectional view taken along line AA, of FIG. 4A.

After forming a first insulating film 110 on a semiconductor substrate 100, as seen in FIG. 4B, a plurality of wiring layers 400, composed of conductive layers which are capped by insulating layers 402, are formed. Insulating layers 402 are not shown in FIG. 4A for clarity. The plurality of wiring layers 400 are formed so as to have a regular, generally parallel spacing and pattern with respect to one another, so that a region on which a contact hole is to be formed therebetween is widely formed with a first width between respective wiring layers and a remaining region therealong is more narrowly formed to a second width which is narrower than the first width. That is, the remaining spacing between respective wiring layers, away from the region for the contact hole, leaves distance "a" minimized.

Figure 5A:
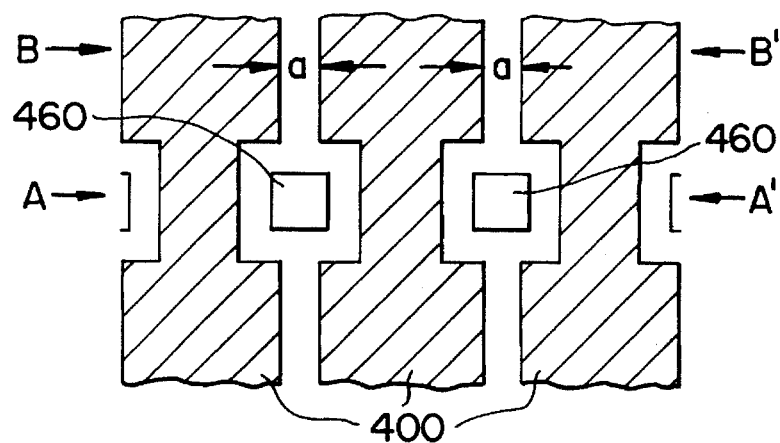
Figure 5B:
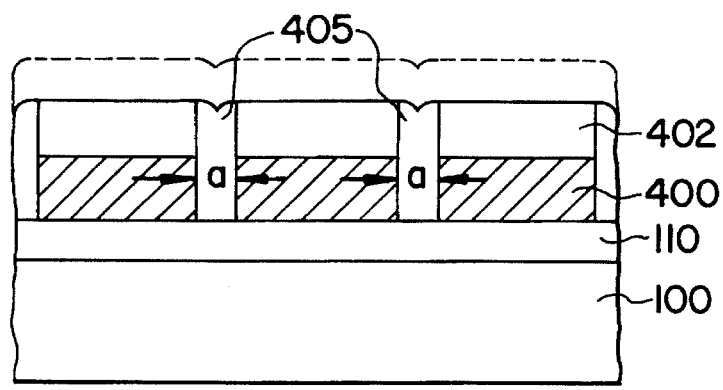
Figure 5C:
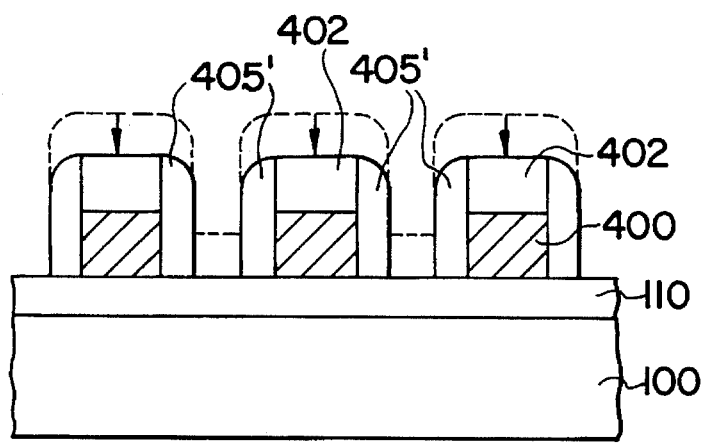

FIG. 5A is a layout diagram of a semiconductor wiring structure wherein a spacer 405' is formed about a region where a contact hole is subsequently formed between adjacent wiring layers, and FIGS. 5B and 5C are cross-sectional views taken along lines BB' and AA' in FIG. 5A, respectively.

After forming a second insulating film 405 which conformally covers the plurality of wiring layers 400, the second insulating film 405 is etched back. As a result, in a portion 460 between adjacent wiring layers 400, where a contact hole will be formed, a spacer 405' is formed on the opposing sidewalls of the adjacent wiring layers 400 having the first width therebetween (refer to FIG. 5C). In the remaining, more narrow portions, between the wiring layers, the spaces having the second width, are filled with the second insulating film 405 (refer to FIG. 5B). The second insulating film 405 must be formed sufficiently thick to fill the spaces formed between those portions of the wiring layer 400 having the second width. Here, the preferred thickness of the insulating film 405 is about half the distance "a" existing between those portions of wiring layers 400 having the second width therebetween.

Figure 6A:
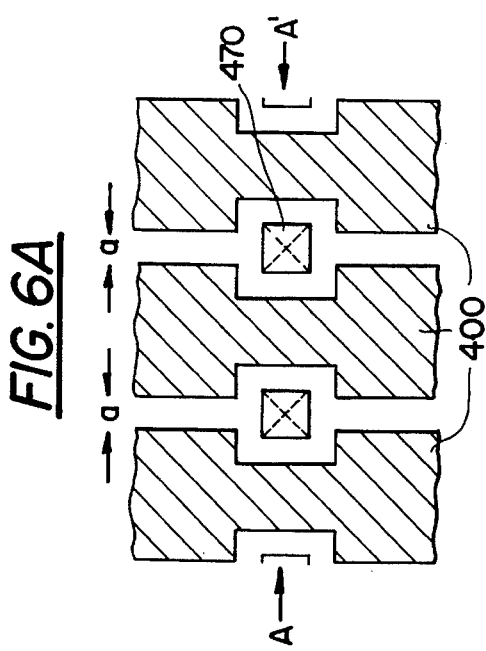
Figure 6B:
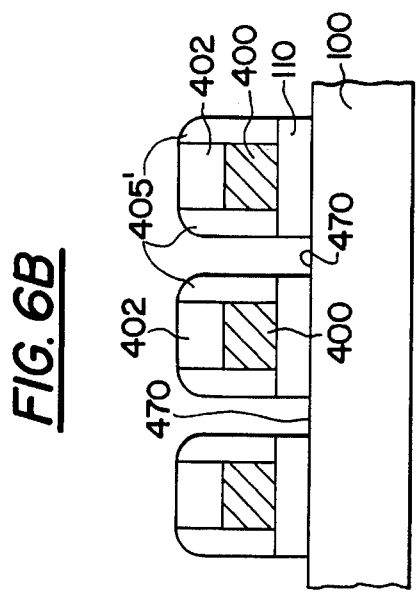

FIG. 6A is a layout diagram of a semiconductor device wiring structure at a manufacturing stage subsequent to that shown in FIG. 5A, wherein a contact hole 470 is formed, and FIG. 6B is a cross-sectional view taken along line AA' of FIG. 6A.

The first insulating film 110 below the wiring layer 400 is etched down to the substrate 100 using the insulating layer 402 and second insulating films 405 and 405' as an etch-mask, to thereby form contact holes 470 which are self-aligned with respect to the wiring layers 400. Therefore, between neighboring wiring layers 400, contact holes 470 are formed in self-alignment with respect to the wiring layers 400 without using a lithography process, with its lithography masks and the like.

An embodiment applying a semiconductor device wiring structure of the present invention to a DRAM cell will be explained in more detail with reference to the attached drawings.

Figure 7:
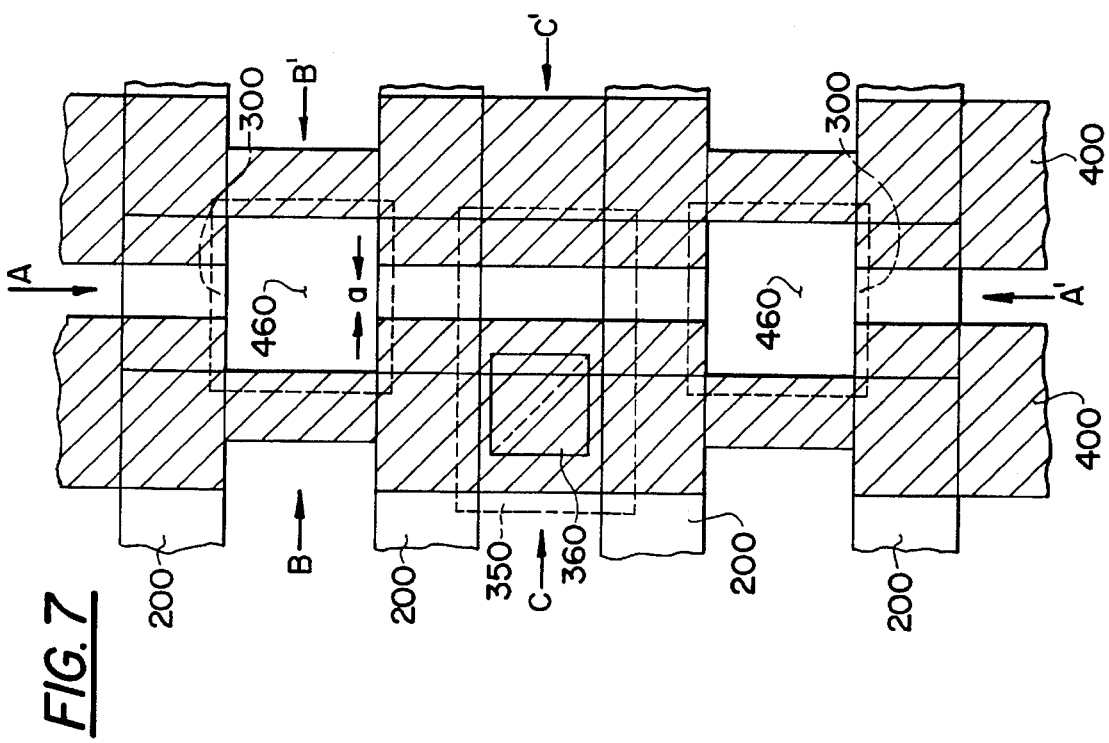
FIG. 7 is a layout diagram of a semiconductor memory device utilizing a wiring structure according to the present invention.

FIG. 7 is a layout diagram of a DRAM cell, using a wiring structure according to the present invention. Reference numeral 200 indicates a gate electrode, numerals 300 and 350 indicate first and second pad electrodes, numeral 360 indicates a bit-line contact hole, numeral 400 indicates a bit-line electrode, and numeral 470 indicates a storage-node contact hole, respectively. As shown in FIG. 7, the bit-line electrodes 400 of the present invention are formed such that a wiring layer portion, which excludes the wiring layer portion adjacent to where a storage-node contact hole will be formed, protrudes toward a neighboring bit-line electrode. Thus, the distance "a" between the neighboring bit-line electrodes is minimized.

Figure 8A:
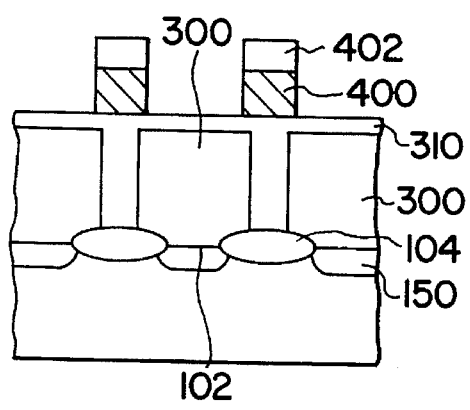
FIGS. 8A & 8B, 9A & 9B and 10 are cross-sectional views for illustrating a method of manufacturing a semiconductor memory device according to one embodiment of the present invention where
Figure 8B:
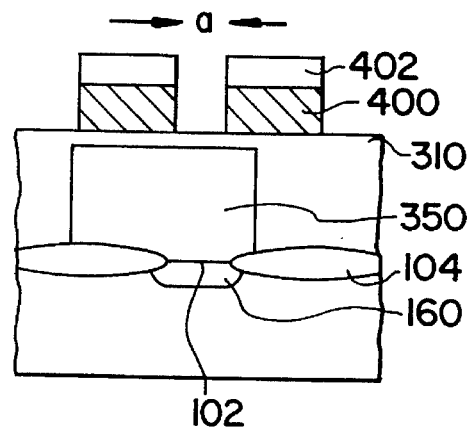
Figure 9A:
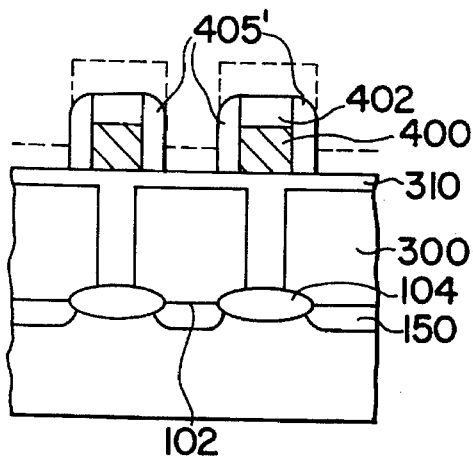
Figure 9B:
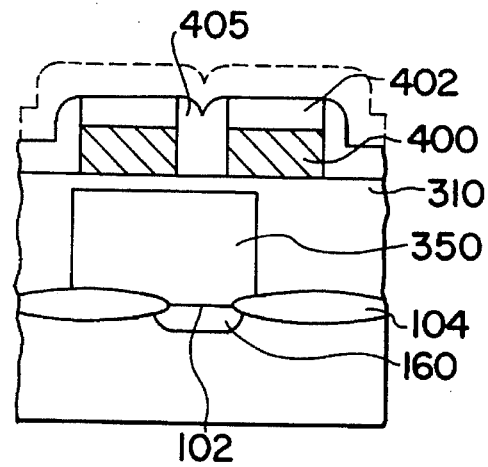
Figure 10:
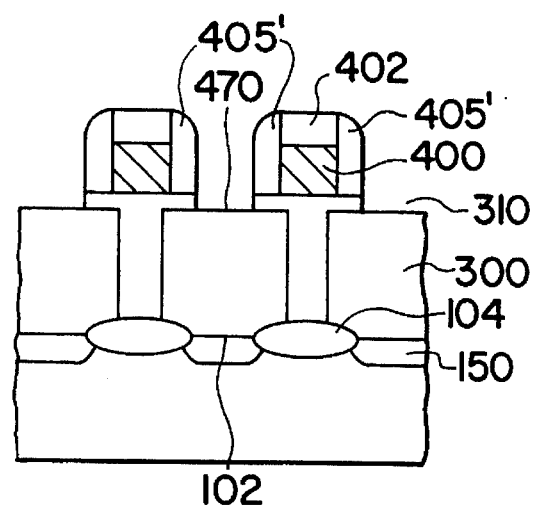

FIGS. 8A through 10 are cross-sectional views for illustrating a method for manufacturing a DRAM cell according to one embodiment of the present invention, wherein FIGS. 8A, 9A and FIGS. 8B, 9B are cross-sectional views taken along line BB' and CC' in FIG. 7, respectively. FIG. 10 is also a cross-sectional view taken along line BB' in FIG. 7.

FIGS. 8A and 8B show a step of forming the first and second pad electrodes 300 and 350, a bit-line contact hole 360, and the bit-line electrodes 400.

A device isolation region 104 is formed on a semiconductor substrate 100 of a first conductivity type, (e.g., P-type), thereby forming an active region 102. Then, after forming a gate oxide film 104 on the substrate 100 by a thermal oxidation process, a conductive material, (e.g., an impurity-doped polycrystalline silicon), is deposited and patterned by a lithography process to obtain gate electrodes 200 (see FIG. 7). After depositing an insulating film, (e.g., an oxide), on the resultant structure on which the gate electrodes 200 are formed, the insulating film is anisotropically etched to form a spacer (not shown) on the sidewalls of the gate electrode 200. A contact hole (not shown) which exposes a portion of the active region 102 is formed in a self-aligned manner with respect to gate electrode 200 during the above-mentioned anisotropic etching process of the insulating film. Then, impurity ions are implanted throughout the entire surface of the resultant structure, including the contact hole, thereby forming first and second impurity regions 150 and 160 of the access transistor in substrate 100, which are spaced apart from one another by the gate electrode 200. Thereafter, a conductive material (e.g., an impurity-doped polycrystalline silicon), is deposited on the resultant structure wherein first and second impurity regions 150 and 160 are formed, and is patterned by a lithography process, thereby forming first and second pad electrodes 300 and 350 which are connected with the first and second impurity regions 150 and 160 of the access transistor, respectively. Then, an insulating material (e.g., a high temperature oxide or boro-phospho-silicate glass (BPSG)), is deposited to a thickness of 500–3000 Å on the resultant structure having the first and second pad electrodes 300 and 350 formed thereon, thereby forming a first interlayer insulating film 310. Then, first interlayer insulating film 310 is selectively etched, to thereby form a bit-line contact hole 360 on the second pad electrode 350 which is connected with the second impurity region 160. A conductive material (e.g., an impurity-doped polycrystalline silicon, or an impurity-doped polycrystalline silicon and a tungsten silicide (WSix) in stacked combination), is deposited to . thicknesses of 500–1000 Å and 1000–2000 Å, respectively, on the resultant structure wherein bit-line contact hole 360 is formed, thereby forming a conductive layer 400. Then, an insulating material, (e.g., a silicon nitride ($Si_3N_4$)), is deposited to a thickness of 1500–3000 Å on the conductive layer 400, thereby forming a second interlayer insulating film 402. Thereafter, the second interlayer insulating film 402 and the conductive layer 400 are patterned by a lithography process, thereby forming bit-line electrodes 400 capped by corresponding second interlayer insulating film portions 402. At this time, the distance "a" between bit-line electrodes 400, beyond a portion (reference numeral 460 in FIG. 7) where a storage-node contact hole is formed, is reduced. For example, according to a lithography process using a KrF excimer laser (248 nm), the above distance "a" is formed to a dimension of 0.2–0.25 μm.

FIGS. 9A and 9B show a step of forming a third interlayer insulating film 405. After forming third interlayer insulating film 405 by depositing an insulating material, (e.g., a silicon nitride), over the bit-line electrodes 400, the third interlayer insulating film 405 is then etched back, thereby filling the spaces which exist between bit-line electrodes 400 with third interlayer insulating film 405. For example, if the distance "a" between bit-line electrodes 400 is 0.2–0.25 μm, and if third interlayer .insulating film 405 is formed to a thickness of 1,500–2,000 Å, the space between bit-line electrodes 400 can be reliably filled. At this time, in the portion 460 where a storage-node contact hole is to be formed, the third interlayer insulating film 405 remains substantially only on the sidewalls of the bit-line electrode 400 as a form spacer 405'.

FIG. 10 shows a step of forming a storage-node contact hole 470. First interlayer insulating film 310 is etched back using the second interlayer insulating film 402 and the third interlayer insulating films 405 and 405' as an etch-mask, thereby forming storage-node contact hole 470 on the first pad electrode 300 which is connected with the first impurity region 150. Here, it is preferable to use materials for the second interlayer insulating film 402 and the third interlayer insulating films 405 and 405' which have different etch rates from that of the material constituting the first interlayer insulating film 310 with respect to an anisotropic etching process. If the etch rate of first interlayer insulating film 310 were similar to that of the second interlayer insulating film 402 and third interlayer insulating films 405 and 405' then the second insulating film 402 and the third insulating films 405 and 405' would be undesirably over-etched when first interlayer insulating film 310 is etched. Therefore, in order to avoid such a problem, the thickness of second interlayer insulating film 402 should be sufficiently thick.

Thereafter, though not shown, a storage node, a dielectric film and a platenode are sequentially formed on the resultant structure, including the storage-node contact hole 470, to thereby complete a cell capacitor.

According to the above-described embodiment of the present invention, the storage-node contact hole, which is self-aligned with respect to the bit-line electrode, is formed without using a lithography process. Therefore, an electrical short, which may occur between the storage node and the bit-line electrode due to misalignment, is advantageously prevented.

Figure 11:
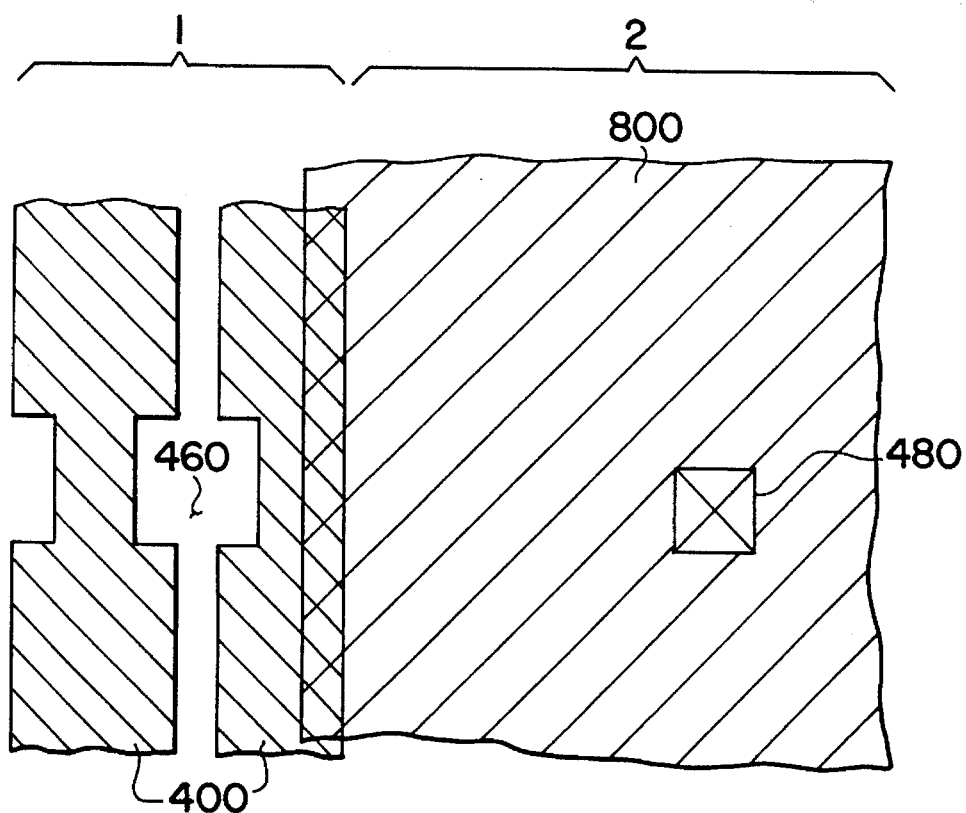
FIG. 11 is a layout diagram for illustrating a semiconductor device wiring structure according to another embodiment of the present invention.

FIG. 11 is a layout diagram for illustrating a semiconductor wiring structure according to another embodiment of the present invention.

Reference numeral 1 denotes a region wherein a plurality of wiring layers 400 come close to each other along one direction, and where a contact hole is formed between the wiring layers 400, such as in the cell array of a semiconductor memory device. Here, the contact hole is formed by the method described above in the first embodiment.

Reference numeral 2 denotes a loose design-rule region in which a contact hole 480 is formed, such as in a peripheral circuit region. In this case, after forming a wiring layers 400, a third interlayer insulating film (like reference numeral 405 in FIGS. 9A and 9B, but not shown here) is formed on the entire surface of the resultant structure, as described with respect to FIGS. 9A and 9B. Thereafter, in region 2, a photoresist 800 is formed, excluding a portion 480 where a contact hole will be formed by a conventional method of contact hole formation using a lithography process. At this time, no portion of the photoresist 800 remains in region 1. The third interlayer insulating film 405 (not shown) is etched using the photoresist 800 as an etch-mask. As a result, a contact hole 480 is formed in the region 2 by a lithography process. In region 1, a contact hole surrounded by a spacer (reference numeral 405' in FIG. 10) is formed in a region 460 where the contact hole 470 will be formed, and a remaining portion between the respective wiring layers 400 is filled with third interlayer insulating film 405.

According to the above-described second embodiment of the present invention, in cases where the formation of a contact hole is needed in a region wherein adjacent wiring layers are not closely formed, the contact hole can be easily formed by a lithography process while still using the method of the above first embodiment.

According to the present invention as described above, in a region wherein a plurality of wiring layers are repeatedly formed and a contact hole is formed between the wiring layers, such as in a cell array of a semiconductor memory device, the wiring layers are formed so that a portion of the respective wiring layers adjacent where a contact hole will be formed are narrowly spaced, each wiring layer having a first wiring width adjacent the contact hole, and a remaining portion more widely spaced than the first width. Since a contact hole is formed in self-alignment fashion with respect to the respective wiring layers, a short, which may occur due to misalignment, is prevented, and the unit memory cell area can be reduced. Therefore, a reliable, highly integrated semiconductor memory device can be obtained. Also, lithography is not used during the formation of the contact hole, and thus, the process is very economical.

It will be understood by those skilled in the art that the foregoing description is a preferred embodiment of the disclosed device and that various changes and modifications may be made in the invention without departing from the spirit and scope thereof as defined by the appended claims.

What is claimed is:

1. A method for manufacturing a semiconductor memory device having a transistor, the transistor including a gate electrode formed on a semiconductor substrate with a gate insulating film disposed therebetween, and first and second impurity regions formed in said semiconductor substrate and spaced apart from each other by said gate electrode, comprising the steps of:

forming a first insulating film over said transistor, said first insulating film having first contact holes which respectively expose said first and second impurity regions;

forming first and second pad electrodes on said first insulating film which are connected with said first and second impurity regions, respectively, through said first contact holes;

forming a second insulating film having second contact holes which expose said first and second pad electrodes, respectively, on the resultant structure having said first and second pad electrodes;

forming a plurality of bit-line electrodes on said second insulating film which are connected with said second pad electrodes through respective said second contact holes, each bit-line electrode being formed so that a portion of the bit-line electrode adjacent to where a third contact hole will be subsequently formed has a first width and a remaining portion of the bit-line electrode has a second width being wider than the first width;

depositing a third insulating film on resultant structure having said bit-line electrodes formed thereon, and etching said third insulating film to thereby fill a space between adjacent said bit-line electrode portions having said second width with said third insulating film, and to form a spacer composed of said third insulating film on the sidewalls of said bit-line electrode portions having said first width, thereby leaving a portion of the second insulating film exposed therethrough; and etching said second insulating film using said third insulating film as an etch-mask to thereby form a third contact hole to expose said first pad electrode.

2. The method according to claim 1, wherein the thickness of the third insulating film is at least about half the distance between adjacent bit-line electrode portions which are of the second width.

3. The method according to claim 1, wherein the material used to form the second insulating film has a different etch rate from that used to form the third insulating film with respect to the etching step for forming the third contact hole.

4. A method for manufacturing a semiconductor wiring structure having a self-aligned contact hole formed between adjacent wiring layers, comprising the steps of:

forming a first insulating film on a substrate;

forming first and second spaced apart and substantially parallel wiring layers on the first insulating film, the first and second wiring layers each having a respective width varying between a first width and a second width which is less than the first width, wherein the first and second wiring layers each have a narrow portion with the second width located between respective wide portions having the first width, the narrow portions of the first and second wiring layers, respectively, being substantially aligned with one another, wherein a region in which the self-aligned contact hole is subsequently formed is at least partially defined by an edge of the narrow portion of the first wiring layer, an edge of the narrow portion of the second wiring layer substantially aligned with the edge of the narrow portion of the first wiring layer, and respective edge portions of the first and second wiring layers extending between the wide portions and the narrow portions thereof;

forming a second insulating film over the first and second wiring layers including the region in which the self-aligned contact hole is formed, whereby the second insulating film substantially fills a space between the respective wide portions of the first and second wiring layers and forms a spacer on sidewalls of the narrow portions of the first and second wiring layers, the spacer leaving a portion of the first insulating film exposed;

forming a self-aligned contact hole in the first insulating film using the spacer as an etch mask; and forming at least a third wiring layer on the second insulating film so as to at least partially cover the self-aligned contact hole.

5. A method according to claim 4, wherein said step of forming the second insulating film on the first and second wiring layers includes forming the second insulating layer to have a thickness of at least about one-half a distance of separation between adjacent wide portions of the first and second wiring layers.

6. A method according to claim 4, wherein said step of forming the first and second wiring layers comprises:

forming a conductive material layer on the first insulating film;

forming a third insulating film on the conductive material layer; and patterning the third insulating film and the conductive material layer to thereby obtain the first and second wiring layers which are capped with corresponding third insulating film portions.

7. A method according to claim 6, wherein said step of forming the second insulating film comprises:

forming the second insulating film on the first insulating film so as to substantially cover the first and second wiring layers formed thereon; and etching back the second insulating film until the third insulating film portions formed on the first and second wiring layers are exposed, whereby the remaining second insulating film substantially fills the space between the wide portions of the first and second wiring layers and forms a spacer along the respective sidewalls of the narrow portions of the first and second wiring layers.

* * * * *